United States Patent
Hsieh et al.

(10) Patent No.: US 10,411,022 B1
(45) Date of Patent: Sep. 10, 2019

(54) SRAM STRUCTURE

(71) Applicant: Taiwan Semiconductor Manufacturing Co., Ltd., Hsinchu (TW)

(72) Inventors: Chih-Hung Hsieh, Hsin-Chu (TW); Yu-Min Liao, Taichung (TW); Jhon-Jhy Liaw, Jhudong Township, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/008,302

(22) Filed: Jun. 14, 2018

(51) Int. Cl.
*H01L 27/11* (2006.01)
*G11C 11/40* (2006.01)
*G11C 11/412* (2006.01)

(52) U.S. Cl.
CPC ........ *H01L 27/1104* (2013.01); *G11C 11/412* (2013.01)

(58) Field of Classification Search
CPC .... G11C 11/412; G11C 11/40; H01L 27/1104
USPC ............................................ 365/154, 63, 72
See application file for complete search history.

(56) References Cited

U.S. PATENT DOCUMENTS

| 9,728,541 B1* | 8/2017 | Huang ............... H01C 27/1116 |
| 2007/0171700 A1* | 7/2007 | Burnett .................. G11C 11/412 365/154 |
| 2013/0258759 A1* | 10/2013 | Liaw .................... G11C 11/412 365/154 |

* cited by examiner

*Primary Examiner* — Tan T. Nguyen
(74) *Attorney, Agent, or Firm* — Birch, Stewart, Kolasch & Birch, LLP

(57) ABSTRACT

SRAM structures are provided. A first SRAM cell is adjacent to a second SRAM cell in the same row. A third SRAM cell is adjacent to the first SRAM cell in the same column. A fourth SRAM cell is adjacent to the second SRAM in the same column. First fins are parallel to a first direction and positioned within the first and third SRAM cells. Second fins are parallel to the first direction and positioned within the second and fourth SRAM cells. A contact bar extends parallel to a second direction to across the first fins and extends parallel to a third direction to across the second fins. A contact plug is formed on the contact bar. VSS line is electrically coupled to the contact bar through the contact plug. The first direction is perpendicular to the second direction. The second direction is opposite to the third direction.

20 Claims, 9 Drawing Sheets

SRAM STRUCTURE

BACKGROUND

Memories are commonly used in integrated circuits. For example, a static random access memory (SRAM) is a volatile memory, and is used in electronic applications where high speed, low power consumption, and simplicity of operation are needed. Embedded SRAM is particularly popular in high-speed communications, image processing, and system-on-chip (SOC) applications. SRAM has the advantage of being able to hold data without requiring a refresh.

SRAM includes a plurality of bit cells disposed in rows and columns to form an array. Each bit cell includes a plurality of transistors coupled to bit lines and word lines that are used to read and write a bit of data to the memory cell. Single-port SRAMs enable a single bit of data to be written to or read from a bit cell at a particular time.

BRIEF DESCRIPTION OF THE DRAWINGS

Aspects of the present disclosure are best understood from the following detailed description when read with the accompanying figures. It should be noted that, in accordance with the standard practice in the industry, various nodes are not drawn to scale. In fact, the dimensions of the various nodes may be arbitrarily increased or reduced for clarity of discussion.

DETAILED DESCRIPTION

Figure 1:
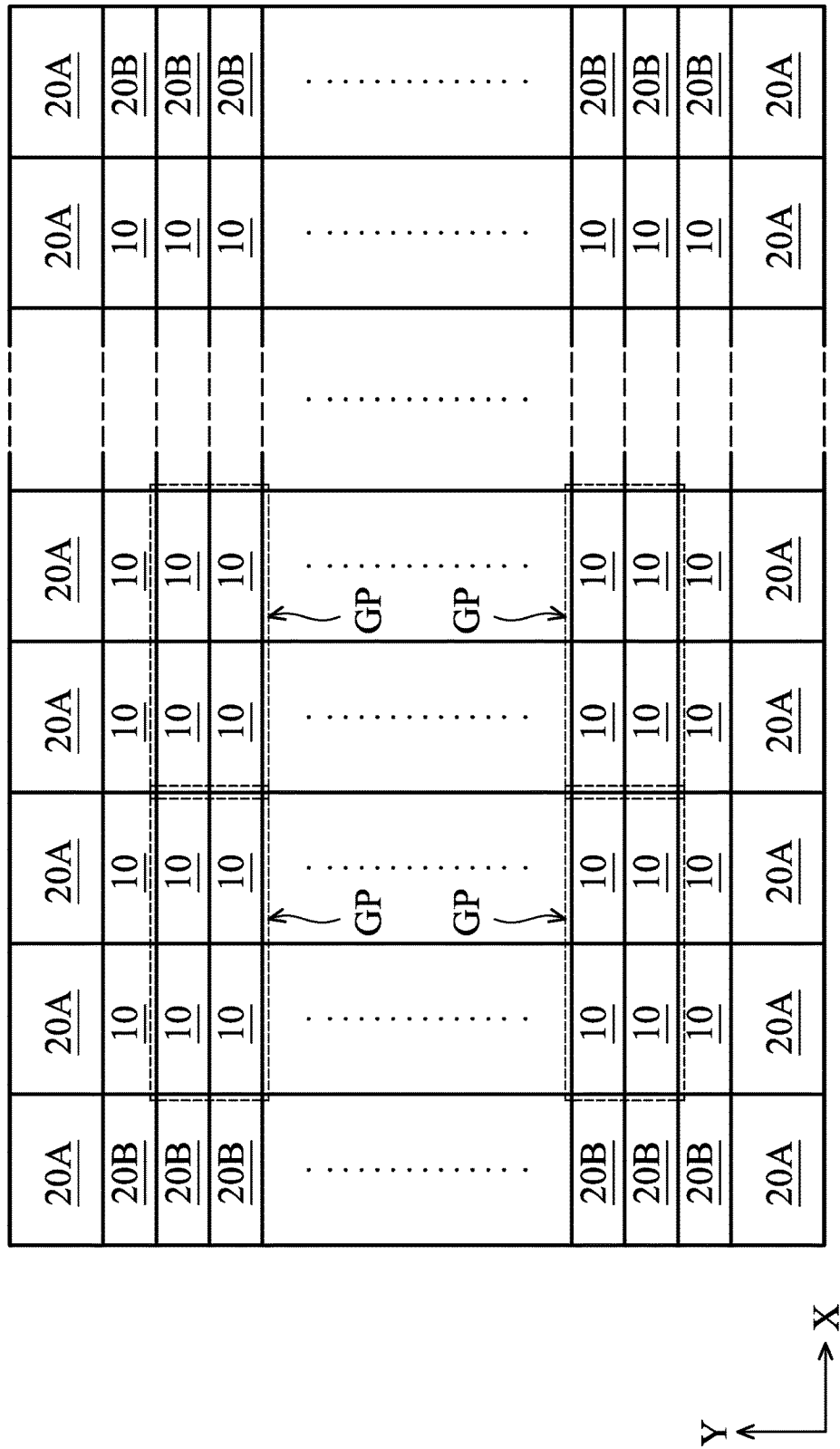
FIG. 1 shows a simplified diagram of a SRAM, in accordance with some embodiments of the disclosure.

The following disclosure provides many different embodiments, or examples, for implementing different nodes of the subject matter provided. Specific examples of components and arrangements are described below to simplify the present disclosure. These are, of course, merely examples and are not intended to be limiting. In some embodiments, the formation of a first node over or on a second node in the description that follows may include embodiments in which the first and second nodes are formed in direct contact, and may also include embodiments in which additional nodes may be formed between the first and second nodes, such that the first and second nodes may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various static random access memory (SRAM) structures are provided in accordance with various exemplary embodiments. Some variations of some embodiments are discussed. Throughout the various views and illustrative embodiments, like reference numbers are used to designate like elements.

FIG. 1 shows a simplified diagram of a SRAM 30, in accordance with some embodiments of the disclosure. The SRAM 30 can be an independent device or be implemented in an integrated circuit (e.g. System-on-Chip (SOC)). The SRAM 30 includes a cell array formed by multiple SRAM cells (or called bit cells) 10, and the SRAM cells 10 are arranged in multiple rows and multiple columns in the cell array.

In the fabrication of SRAM cells, the cell array may be surrounded by multiple strap cells 20A and multiple edge cells 20B, and the strap cells 20A and the edge cells 20B are dummy cells for the cell array. In some embodiments, the strap cells 20A are arranged to surround the cell array horizontally, and the edge cells 20B are arranged to surround the cell array vertically. The shapes and sizes of the strap cells 20A and the edge cells 20B are determined according to actual application. In some embodiments, the shapes and sizes of the strap cells 20A and the edge cells 20B are the same as the SRAM cells 10. In some embodiments, the shapes and sizes of the strap cells 20A, the edge cells 20B and the SRAM cells 10 are different.

In the SRAM 30, each SRAM cell 10 has the same rectangular shape/region, e.g., the widths and heights of the SRAM cells are the same. The configurations of the SRAM cells 10 are described below.

In the cell array of the SRAM 30, the SRAM cells 10 are divided into multiple groups GP, and each group GP includes four adjacent SRAM cells 10. The groups GP will be described in detail below.

Figure 2A:
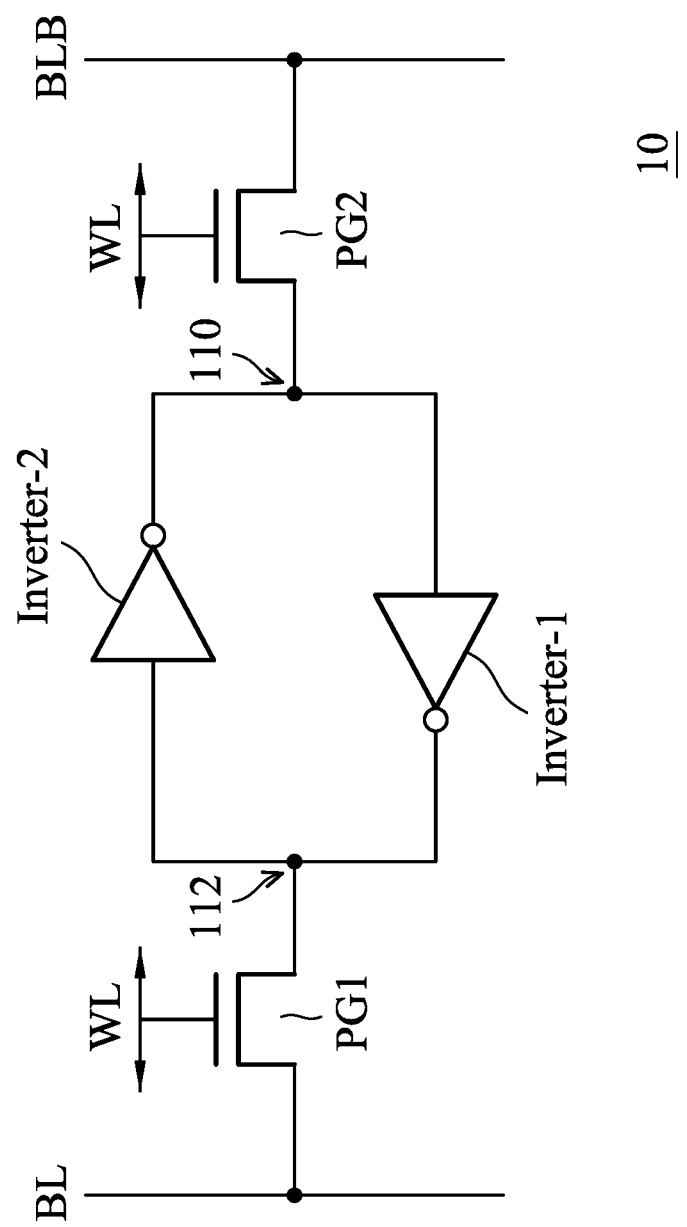
FIG. 2A shows a single-port SRAM cell, in accordance with some embodiments of the disclosure.

FIG. 2A shows a single-port SRAM cell 10, in accordance with some embodiments of the disclosure. The bit cell 10 includes a pair of cross-coupled inverters Inverter-1 and Inverter-2, and two pass-gate transistors PG1 and PG2. The inverters Inverter-1 and Inverter-2 are cross-coupled between the nodes 112 and 110, and form a latch. The pass-gate transistor PG1 is coupled between a bit line BL and the node 112, and the pass-gate transistor PG2 is coupled between a complementary bit line BLB and the node 110, wherein the complementary bit line BLB is complementary to the bit line BL. The gates of the pass-gate transistors PG1 and PG2 are coupled to the same word-line WL. Furthermore, the pass-gate transistors PG1 and PG2 are NMOS transistors.

Figure 2B:
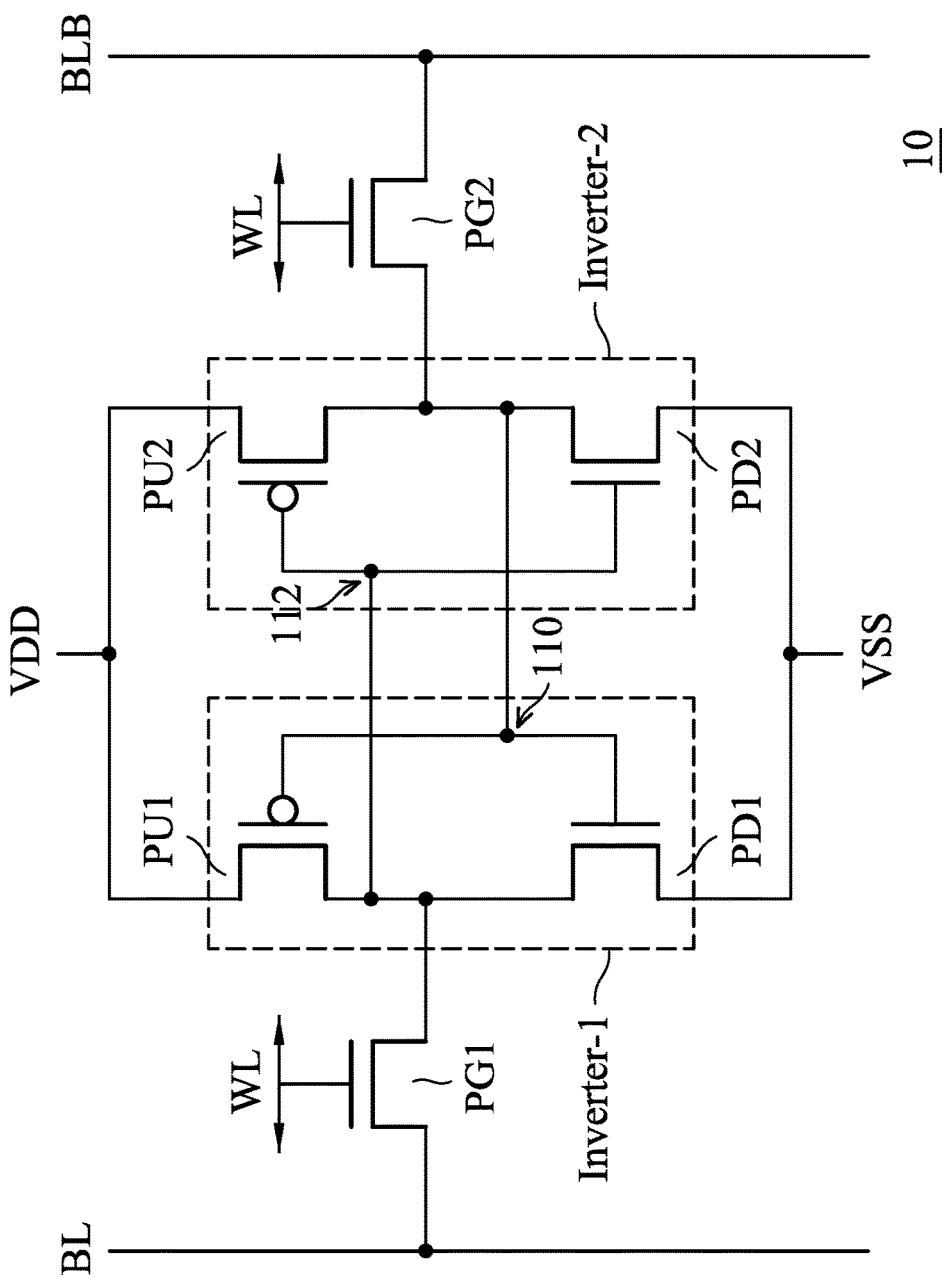
FIG. 2B shows a simplified diagram of the SRAM cell of FIG. 2A, in accordance with some embodiments of the disclosure.

FIG. 2B shows a simplified diagram of the SRAM cell 10 of FIG. 2A, in accordance with some embodiments of the disclosure. The inverter Inverter-1 includes a pull-up transistor PU1 and a pull-down transistor PD1. The pull-up transistor PU1 is a PMOS transistor, and the pull-down transistor PD1 is an NMOS transistor. The drain of the pull-up transistor PU1 and the drain of the pull-down transistor PD1 are coupled to the node 112 connecting the pass-gate transistor PG1. The gates of the pull-up transistor PU1 and the pull-down transistor PD1 are coupled to the node 110 connecting the pass-gate transistor PG2. Furthermore, the source of the pull-up transistor PU1 is coupled to the positive power supply node VDD, and the source of the pull-down transistor PD1 is coupled to a ground VSS.

Similarly, the inverter Inverter-2 includes a pull-up transistor PU2 and a pull-down transistor PD2. The pull-up transistor PU2 is a PMOS transistor, and the pull-down transistor PD2 is an NMOS transistor. The drains of the pull-up transistor PU2 and the pull-down transistor PD2 are coupled to the node 110 connecting the pass-gate transistor PG2. The gates of the pull-up transistor PU2 and the pull-down transistor PD2 are coupled to the node 112 connecting the pass gate transistor PG1. Furthermore, the source of the pull-up transistor PU2 is coupled to the positive power supply node VDD, and the source of the pull-down transistor PD2 is coupled to the ground VSS.

In some embodiments, the pass-gate transistors PG1 and PG2, the pull-up transistors PU1 and PU2, and the pull-down transistors PD1 and PD2 of the SRAM cell 10 are fin field effect transistors (FinFETs).

In some embodiments, the pass-gate transistors PG1 and PG2, the pull-up transistors PU1 and PU2, and the pull-down transistors PD1 and PD2 of the SRAM cell 10 are planar MOS devices.

Figure 3:
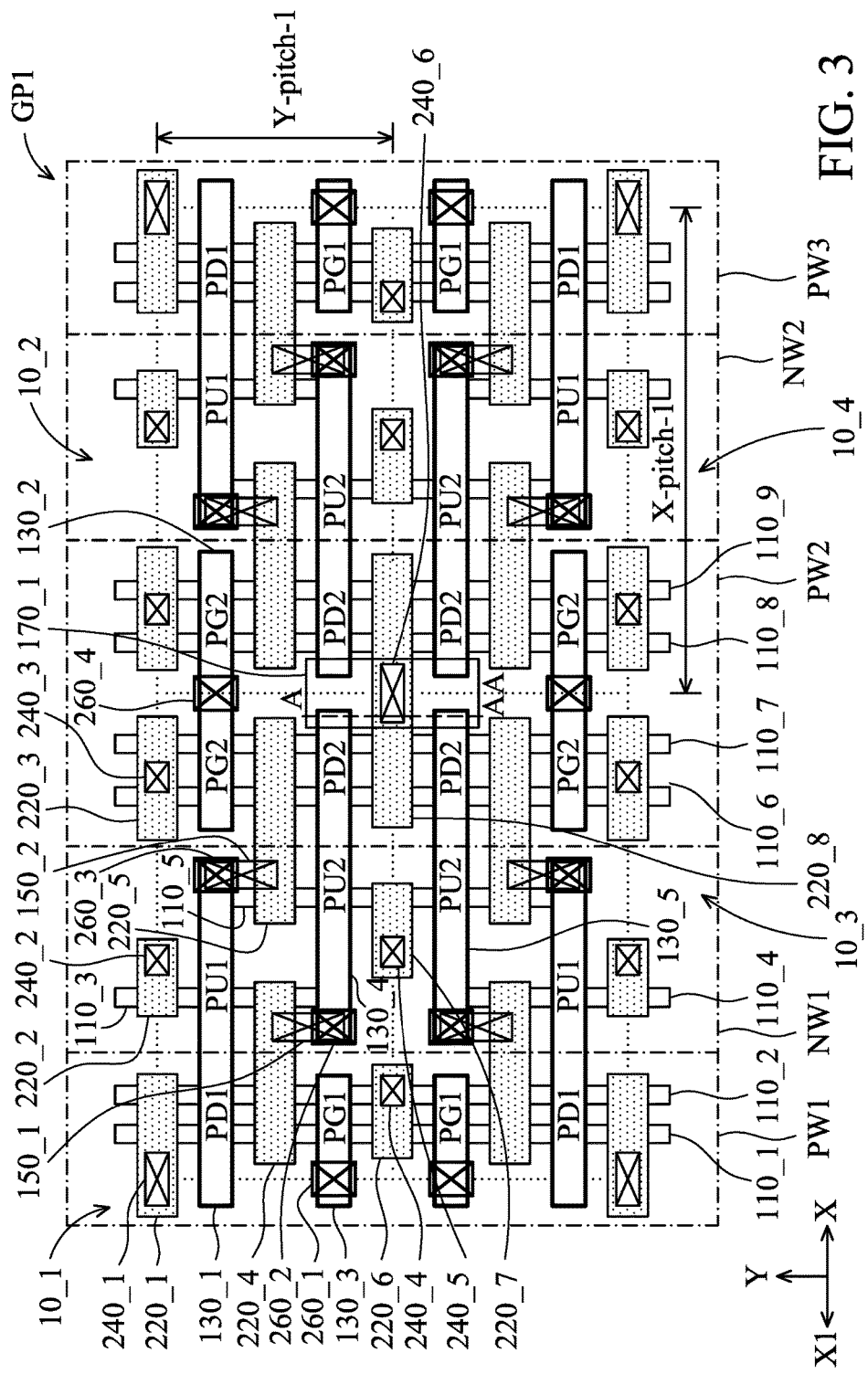
FIG. 3 shows a layout illustrating a SRAM structure of a group GP1 of the SRAM of FIG. 1, in accordance with some embodiments of the disclosure.

FIG. 3 shows a layout illustrating a SRAM structure of a group GP1 of the SRAM 30 of FIG. 1, in accordance with some embodiments of the disclosure. The group GP1 includes four SRAM cells 10_1, 10_2, 10_3 and 10_4. The two adjacent SRAM cells 10_1 and 10_2 are arranged in the same row of the cell array of the SRAM 30. The two adjacent SRAM cells 10_1 and 10_3 are arranged in the same column of the cell array of the SRAM 30. The two adjacent SRAM cells 10_2 and 10_4 are arranged in the same column of the cell array of the SRAM 30. In other words, the two adjacent SRAM cells 10_3 and 10_4 are arranged in the same row of the cell array of the SRAM 30.

In the group GP1, each of the SRAM cells 10_1, 10_2, 10_3 and 10_4 has the same rectangular shape/region with a width X-pitch-1 and a height Y-pitch-1, and the height Y-pitch-1 is less than the width X-pitch-1.

A interconnect structure of the fourth adjacent SRAM cells 10_1 through 10_4 will be described in detail below. It should be noted that various levels of the interconnect structure shown in FIG. 3 is merely an example and is not intended to limit the SRAM cells 10 of the SRAM 30.

In the SRAM cell 10_1, the semiconductor fins 110_1 and 110_2 are configured to serve as the channel regions of the pass-gate transistor PG1 and the pull-down transistor PD1. Furthermore, the pass-gate transistor PG1 and the pull-down transistor PD1 are formed in the P-type well region PW1. In such embodiments, the semiconductor fins 110_1 and 110_2 are positioned within the SRAM cells 10_1 and 10_3.

For the pass-gate transistor PG1, a gate electrode (which may be formed of polysilicon) 130_3 is configured to electrically connect to a gate structure (not shown) corresponding to a gate region of the pass-gate transistor PG1, and the contact bars 220_4 and 220_6 are configured to electrically connect to the drain and source regions of the pass-gate transistor PG1, respectively. In some embodiments, the gate structure includes a gate dielectric and a gate electrode formed over the gate dielectric. A portion of the semiconductor fins 110_1 and 110_2 overlap the gate electrode 130_3 and may serve as a channel region of the pass-gate transistor PG1. Furthermore, portions of the semiconductor fins 110_1 and 110_2 that are not covered by the gate electrode 130_3 serve as the drain region and the source region of the pass-gate transistor PG1. The word line WL (not shown) corresponding to the SRAM cell 10_1 is coupled to the gate region of the pass-gate transistor PG1 through the gate contact 260_1 and the gate electrode 130_3. The contact plug 240_4 is configured to electrically connect the contact bar 220_6 to an overlying level (not shown), such as a metallization layer, so as to connect a bit line BL (not shown) to the source region of the pass-gate transistor PG1 through the contact plug 240_4 and the contact bar 220_6.

For the pull-down transistor PD1, a gate electrode 130_1 is configured to electrically connect a gate structure corresponding to a gate region of the pull-down transistor PD1, and the contact bars 220_4 and 220_1 are configured to electrically connect to the drain and source regions of the pull-down transistor PD1, respectively. The contact plug 240_1 is configured to electrically connect the contact bar 220_1 to an overlying level (not shown), such as a metallization layer, so as to connect a VSS line (not shown) to the source region of the pull-down transistor PD1 through the contact plug 240_1 and the contact bar 220_1.

In the SRAM cell 10_1, the semiconductor fin 110_3 is configured to serve as the channel region of the pull-up transistor PU1. Furthermore, the pull-up transistor PU1 is formed in the N-type well region NW1. For the pull-up transistor PU1, the gate electrode 130_1 is configured to electrically connect a gate structure corresponding to a gate region of the pull-up transistor PU1, and the contact bars 220_4 and 220_2 are configured to electrically connect to the drain and source regions of the pull-up transistor PU1, respectively. As described above, the gate electrode 130_1 is also electrically coupled to the gate region of the pull-down transistor PD1, and the contact bar 220_4 is also electrically coupled to the drain regions of the pull-down transistor PD1 and the pass-gate transistor PG1. The contact plug 240_2 is configured to electrically connect the contact bar 220_2 to an overlying level (not shown), such as a metallization layer, so as to connect a VDD line (not shown) to the source region of the pull-up transistor PU1 through the contact plug 240_2 and the contact bar 220_2.

In the SRAM cell 10_1, the semiconductor fin 110_5 is configured to serve as the channel region of the pull-up transistor PU2. Furthermore, the pull-up transistor PU2 is formed in the N-type well region NW1. For the pull-up transistor PU2, the gate electrode 130_4 is configured to electrically connect a gate structure corresponding to a gate region of the pull-up transistor PU2, and the contact bars 220_5 and 220_7 are configured to electrically connect to the drain and source regions of the pull-up transistor PU2, respectively. Furthermore, the contact bar 220_5 is configured to electrically connect to the gate electrode 130_1 through the contact 150_2 and the gate contact 260_3, thus the drain region of the pull-up transistor PU2 is electrically coupled to the gate regions of the pull-up transistor PU1 and the pull-down transistor PD1. Moreover, the gate electrode 130_4 is configured to electrically connect to the contact bar 220_4 through the contact 150_1 and the gate contact 260_2, thus the gate region of the pull-up transistor PU2 is electrically coupled to the drain regions of the pull-up transistor PU1, the pull-down transistor PD1, and the pass-gate transistor PG1. The contact plug 240_5 is configured to electrically connect the contact bar 220_7 to an overlying level (not shown), such as a metallization layer, so as to connect a VDD line (not shown) to the source region of the pull-up transistor PU2 through the contact plug 240_5 and the contact bar 220_7.

In the SRAM cell 10_1, the semiconductor fins 110_6 and 110_7 are configured to serve as the channel regions of the pass-gate transistor PG2 and the pull-down transistor PD2. Furthermore, the pass-gate transistor PG2 and the pull-down transistor PD2 are formed in the P-type well region PW2. In some embodiments, the N-type well region NW1 is positioned between the P-type well regions PW1 and PW2. In such embodiments, the semiconductor fins 110_6 and 110_7 are positioned within the SRAM cells 10_1 and 10_3.

For the pass-gate transistor PG2, a gate electrode 130_2 is configured to electrically connect a gate structure corresponding to a gate region of the pass-gate transistor PG2, and the contact bars 220_5 and 220_3 are configured to electrically connect to the drain and source regions of the pass-gate transistor PG2, respectively. The contact plug 240_3 is configured to electrically connect the contact bar 220_3 to an overlying level (not shown), such as a metallization layer, so as to connect a complementary bit line BLB (not shown) to the source region of the pass-gate transistor PG2 through the contact plug 240_3 and the contact bar 220_2.

For the pull-down transistor PD2, the gate electrode 130_4 is configured to electrically connect a gate structure corresponding to a gate region of the pull-down transistor PD2, and the contact bars 220_5 and 220_8 are configured to electrically connect to the drain and source regions of the pull-down transistor PD2, respectively. As described above, the gate electrode 130_4 is also electrically coupled to the gate region of the pull-up transistor PU2, thus the gate region of the pull-down transistor PD2 is also electrically coupled to the drain regions of the pull-up transistor PU1, the pull-down transistor PD1, and the pass-gate transistor PG1. Moreover, the contact bar 220_5 is electrically coupled to the drain region of the pull-up transistor PU2 and to the gate electrode 130_1 through the contact 150_2 and the gate contact 260_3, thus the drain regions of the pull-down transistor PD2 and the pass-gate transistor PG2 are also electrically coupled to the drain region of the pull-up transistor PU2, and the gate regions of the pull-up transistor PU1 and the pull-down transistor PD1. The contact plug 240_6 is configured to electrically connect the contact bar 220_8 to an overlying level (e.g., a metallization layer), so as to connect a VSS line 170_1 to the source region of the pull-down transistor PD2 through the contact plug 240_6 and the contact bar 220_8.

In the SRAM cells 10, the semiconductor fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the semiconductor fins.

In some embodiments, the two adjacent SRAM cells 10_1 and 10_2 are arranged in mirror symmetry along the Y-direction. Thus, the gate electrode 130_2 is shared by the gate regions of the pass-gate transistors PG2 of the SRAM cells 10_1 and 10_2. In some embodiments, the word line WL corresponding to the SRAM cells 10_1 and 10_2 is coupled to the gate region of the pass-gate transistor PG2 through the gate contact 260_4 and the gate electrode 130_2. Furthermore, the contact bar 220_8 is shared by the source regions of the pull-down transistors PD2 of the SRAM cells 10_1 and 10_2. Similarly, the two adjacent SRAM cells 10_3 and 10_4 are arranged in mirror symmetry along the Y-direction.

In some embodiments, the two adjacent SRAM cells 10_1 and 10_3 are arranged in mirror symmetry along the X-direction. Thus, the contact bar 220_6 is shared by the source regions of the pass-gate transistors PG1 of the SRAM cells 10_1 and 10_3. The contact bar 220_7 is shared by the source regions of the pull-up transistors PU2 of the SRAM cells 10_1 and 10_3. The contact bar 220_8 is shared by the source regions of the pull-down transistors PD2 of the SRAM cells 10_1 and 10_3. Similarly, the two adjacent SRAM cells 10_2 and 10_4 are arranged in mirror symmetry along the X-direction.

In the SRAM cells 10_1 through 10_4 of the group GP1, the pull-down transistors PD1 and PD2 and the pass-gate transistors PG1 and PG2 are dual-fin field-effect transistors (FETs), and the pull-up transistors PU1 and PU2 are single-fin FETs.

The semiconductor fins of the group GP1 are arranged to parallel to the Y-direction. The semiconductor fins 110_6 and 110_7 are configured to serve as the channel regions of the pass-gate transistor PG2 and the pull-down transistor PD2 of the SRAM cells 10_1 and 10_3. The semiconductor fins 110_8 and 110_9 are configured to serve as the channel regions of the pass-gate transistor PG2 and the pull-down transistor PD2 of the SRAM cells 10_2 and 10_4. In such embodiments, the semiconductor fins 110_8 and 110_9 are positioned within the SRAM cells 10_2 and 10_4.

The contact bar 220_8 is arranged to extend parallel to the X-direction, to across the semiconductor fins 110_8 and 110_9, and is also arranged to extend parallel to the X1-direction, to across the semiconductor fins 110_6 and 110_7. The X1-direction is opposite to the X-direction, and the Y-direction is perpendicular to the X-direction.

The contact bar 220_8 is positioned between the SRAM cells 10_1, 10_2, 10_3 and 10_4, such as an intersection of the SRAM cells 10_1, 10_2, 10_3 and 10_4. The contact bar 220_8 is electrically coupled to the VSS line 170_1 through the contact plug 240_6. The VSS line 170_1 is a metal line formed in a metallization layer.

In such embodiments, the P-type well region PW2 is arranged in the middle of the SRAM cells 10_1 and 10_2, and the N-type well regions NW1 and NW2 are arranged on opposite sides of the P-type well region PW2. Furthermore, the N-type well region NW1 is arranged between the P-type well regions PW1 and PW2, and the N-type well region NW2 is arranged between the P-type well regions PW2 and PW3.

In the group GP1 of FIG. 3, two shapes of the contact plugs are used. The contact plugs 240_1 and 240_6 have first shape, and the contact plugs 240_2, 240_3, 240_4 and 240_5 have second shape.

Figure 4B:
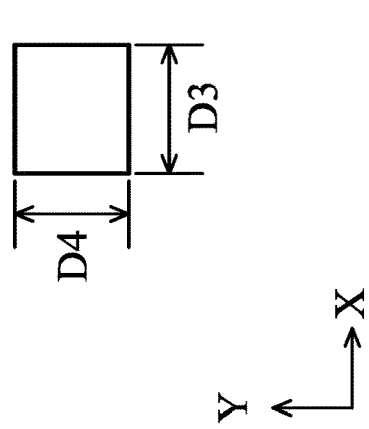
FIG. 4B shows a top view of the contact plug with the second shape in FIG. 3.
Figure 4A:
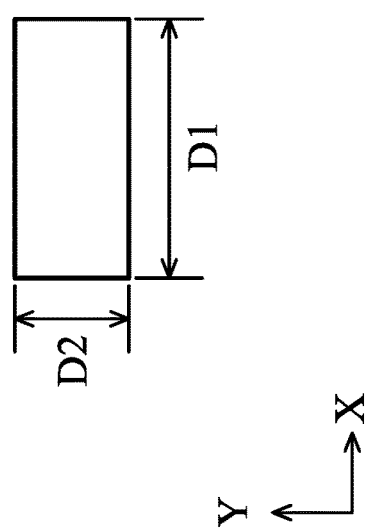
FIG. 4A shows a top view of the contact plug with the first shape in FIG. 3.

FIG. 4A shows a top view of the contact plug with the first shape in FIG. 3. The first shape may be a rectangular shape with a first dimension D1 along the X-direction and a second dimension D2 along the Y-direction. In some embodiments, the ratio of the first dimension D1 to the second dimension D2 is greater than 1.2, i.e., D1>1.2×D2.

FIG. 4B shows a top view of the contact plug with the second shape in FIG. 3. The second shape may be a square shape with a third dimension D3 along the X-direction and a fourth dimension D4 along the Y-direction. In some embodiments, the ratio of the third dimension D3 to the fourth dimension D4 is between 0.8 and 1.2, i.e., 0.8× D3≤D4≤1.2×D3.

In some embodiments, the fourth dimension D4 of the second shape is equal to the second dimension D2 of the first shape, and the first dimension D1 of the first shape is greater than the third dimension D3 of the second shape. Because area of the contact plug with the first shape is greater than that of the contact plugs with the second shape, the equivalent impedance of the contact plug with the first shape is smaller than that of the contact plug with the second shape. Thus, compared with the contact plug with the second shape, IR-drop is decreased for the contact plug with the first shape. In some embodiments, the contact plug with the first shape is configured to electrically connect a VSS line for current sink purpose.

Figure 5:
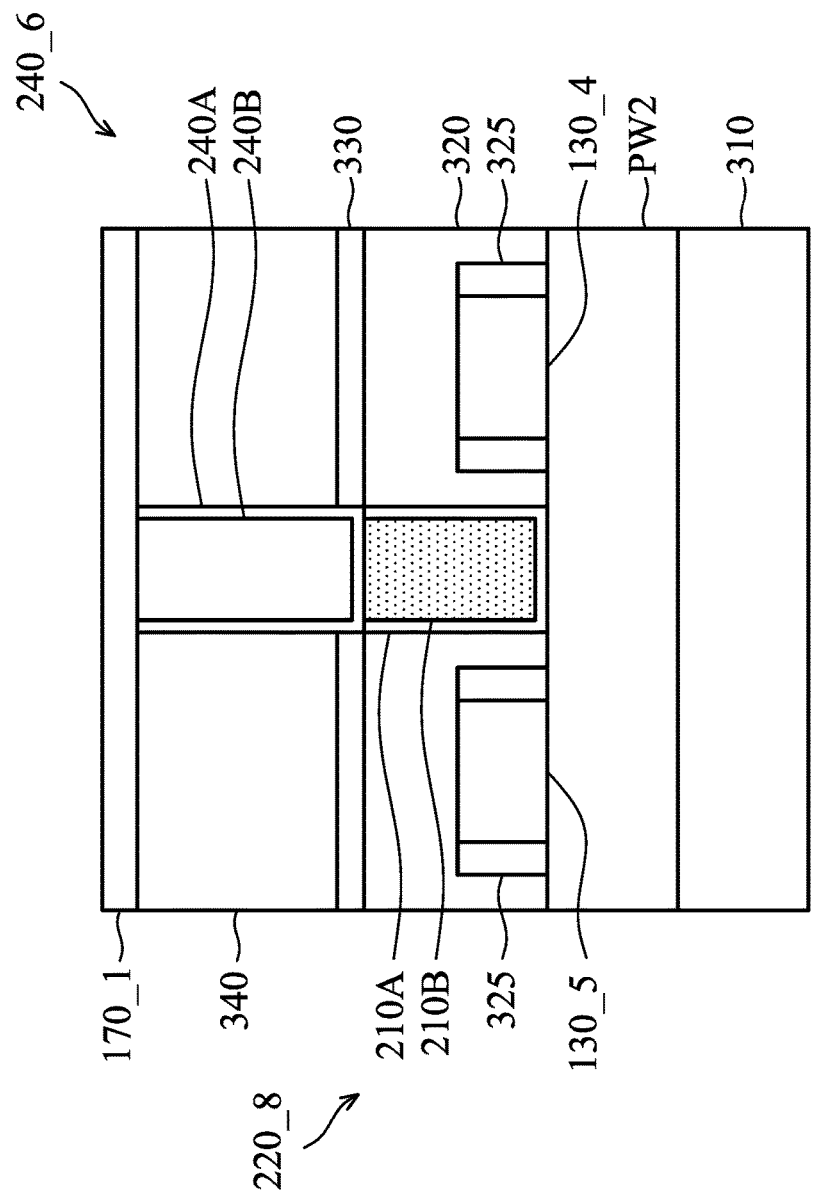
FIG. 5 shows a cross-sectional view of the SRAM structure of the group along section line A-AA view of FIG. 3, in accordance with some embodiments of the disclosure.

FIG. 5 shows a cross-sectional view of the SRAM structure of the group GP1 along section line A-AA view of FIG. 3, in accordance with some embodiments of the disclosure. The P-type well PW2 is formed on a substrate 310. In some embodiments, the substrate 310 is a Si substrate. The gate electrodes 130_4 and 130_5 are formed on the P-type well PW2. In some embodiments, the gate electrodes 130_4 and 130_5 are made of a conductive material, such as aluminum (Al), copper (Cu), tungsten (W), titanium (Ti), tantalum (Ta), or another applicable material. Furthermore, the spacers 325 are formed on opposite sides of the gate electrodes 130_4 and 130_5. In some embodiments, the spacers 325 are made of silicon nitride, silicon oxynitride, silicon carbide, another suitable material, or a combination thereof.

Inter-Layer Dielectric (ILD) 320 is formed over the substrate 310 and the gate electrodes 130_5 and 130_4. The ILD 320 may be formed of an oxide such as Phospho-Silicate Glass (PSG), Boro-Silicate Glass (BSG), Boron-Doped Phospho-Silicate Glass (BPSG), Tetra Ethyl Ortho Silicate (TEOS) oxide, or the like.

The contact bar 220_8 is formed in the ILD 320. The contact bar 220_8 includes a barrier layer 210A and a cobalt-containing (Co-containing) region 210B. The etch stop layer 330 is formed over, and may be in physical contact with, the top surfaces of the ILD 320. In some embodiments, the etch stop layer 330 is formed of silicon nitride or other dielectric materials, such as silicon carbide, silicon oxynitride, or the like. Moreover, another ILD 340 is formed over the etch stop layer 330. The ILD 340 may be formed of PSG, BSG, BPSG, TEOS oxide, or the like.

The contact plug 240_6 is aligned to, and in contact with, the contact bar 220_8. The contact plug 240_6 includes a barrier layer 240A and a cobalt-containing region 240B. In some embodiments, the contact plug 240_6 is an upper source/drain contact, and the contact bar 220_8 is a lower source/drain contact. Moreover, the VSS line 170_1 is formed on the ILD 340 and the contact plug 240_6.

In some embodiments, each the contact plugs 240_1 through 240_6 of the group GP1 in FIG. 3 includes the barrier layer 240A and the cobalt-containing region 240B.

Figure 6:
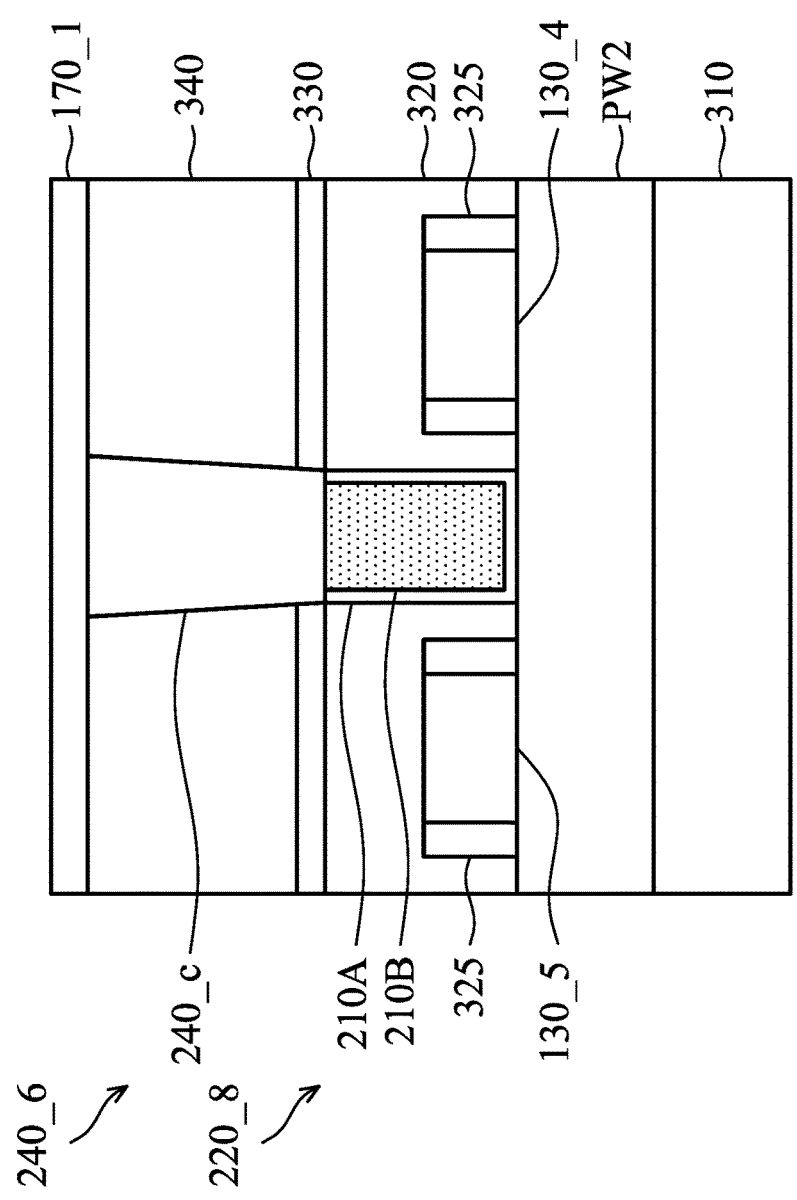
FIG. 6 shows a cross-sectional view of the SRAM structure of the group along section line A-AA view of FIG. 3, in accordance with some embodiments of the disclosure.

FIG. 6 shows a cross-sectional view of the SRAM structure of the group GP1 along section line A-AA view of FIG. 3, in accordance with some embodiments of the disclosure. Compared with the contact plug 240_6 of FIG. 5, the contact plug 240_6 of FIG. 6 includes a tungsten-containing (W-containing) region 240C without a barrier layer (e.g., 240A of FIG. 5). In some embodiments, by using the tungsten-containing region without a barrier layer as the contact plug 240_6, IR drop is avoided during processes of the SRAM 30, thereby preventing damage in the contact plug 240_6 and cobalt-loss in the contact bar 220_8.

In some embodiments, each of the contact plugs 240_1 through 240_6 of the group GP1 in FIG. 3 includes the tungsten-containing region 240C without a barrier layer.

In some embodiments, the contact plugs coupled to the VSS lines, such as the contact plugs 240_1 and 240_6 of SRAM cell 10_1, include the tungsten-containing region 240C without a barrier layer, and the other contact plugs, such as the contact plugs 240_2 through 240_5 of SRAM cell 10_1, include a barrier layer 240A and a cobalt-containing region 240B.

Figure 7:
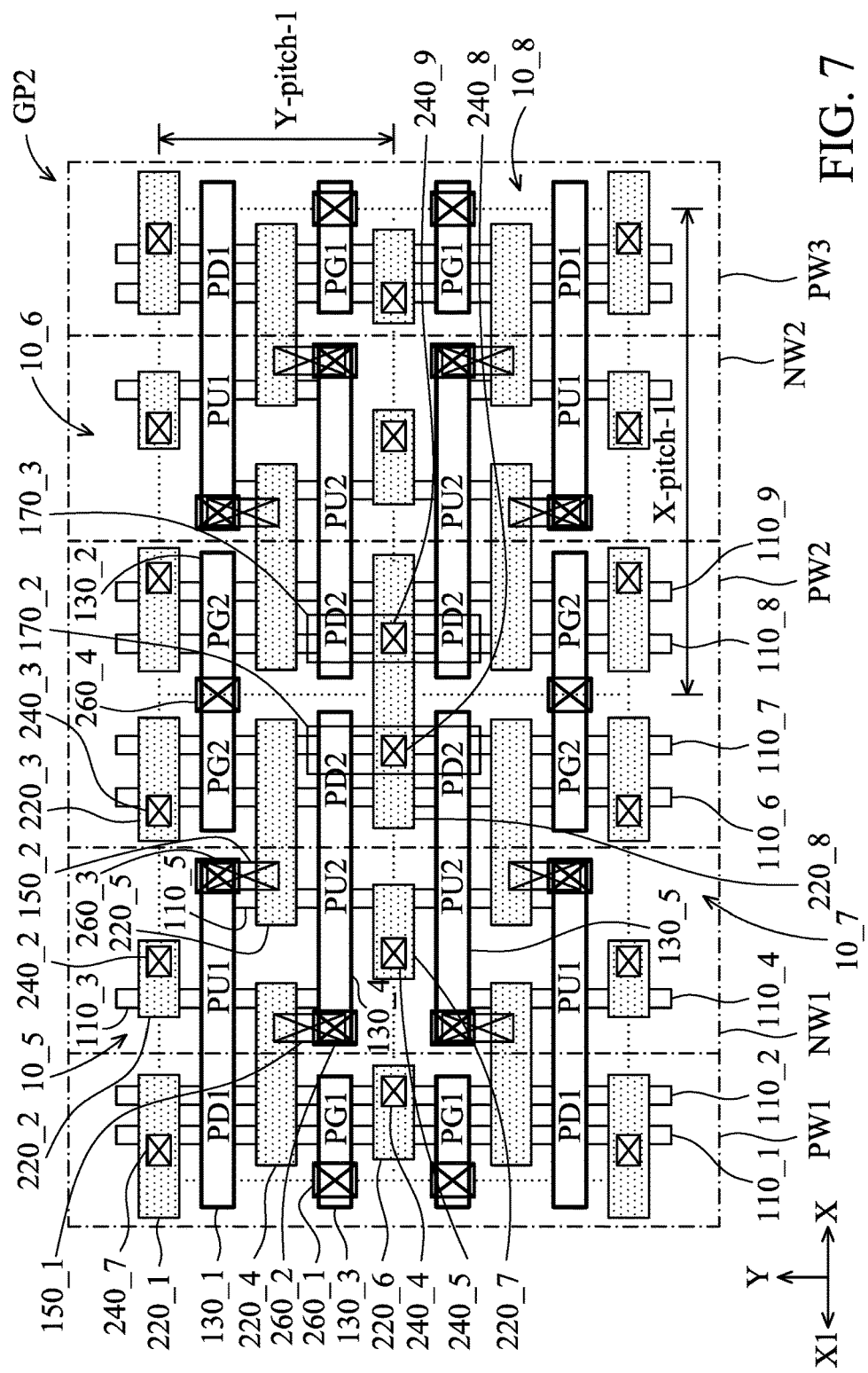
FIG. 7 shows a layout illustrating a SRAM structure of a group GP2 of the SRAM of FIG. 1, in accordance with some embodiments of the disclosure.

FIG. 7 shows a layout illustrating a SRAM structure of a group GP2 of the SRAM 30 of FIG. 1, in accordance with some embodiments of the disclosure. The group GP2 includes four SRAM cells 10_5, 10_6, 10_7 and 10_8. The two adjacent SRAM cells 10_5 and 10_6 are arranged in the same row of the cell array of the SRAM 30. The two adjacent SRAM cells 10_5 and 10_7 are arranged in the same column of the cell array of the SRAM 30. The two adjacent SRAM cells 10_6 and 10_8 are arranged in the same column of the cell array of the SRAM 30. In other words, the two adjacent SRAM cells 10_7 and 10_8 are arranged in the same row of the cell array of the SRAM 30. In the group GP2, each of the SRAM cells 10_5, 10_6, 10_7 and 10_8 has the same rectangular shape/region with a width X-pitch-1 and a height Y-pitch-1, and the height Y-pitch-1 is less than the width X-pitch-1.

A interconnect structure of the fourth adjacent SRAM cells 10_5 through 10_8 will be described below. It should be noted that various levels of the interconnect structure shown in FIG. 7 is merely an example and is not intended to limit the SRAM cells 10 of the SRAM. Furthermore, features in the group GP2 similar to those in the group GP1 of FIG. 3 will be omitted.

In the SRAM cells 10_5 through 10_8 of the group GP2, the pull-down transistors PD1 and PD2 and the pass-gate transistors PG1 and PG2 are dual-fin FETs, and the pull-up transistors PU1 and PU2 are single-fin FETs.

In some embodiments, the two adjacent SRAM cells 10_5 and 10_6 are arranged in mirror symmetry along the Y-direction. The two adjacent SRAM cells 10_7 and 10_8 are arranged in mirror symmetry along the Y-direction. Furthermore, the two adjacent SRAM cells 10_5 and 10_7 are arranged in mirror symmetry along the X-direction, and the two adjacent SRAM cells 10_6 and 10_8 are arranged in mirror symmetry along the X-direction.

For the pull-down transistor PD1 of the SRAM cell 10_5, the contact plug 240_7 is configured to electrically connect the contact bar 220_1 to an overlying level (not shown), such as a metallization layer, so as to connect a VSS line (not shown) to the source region of the pull-down transistor PD1 through the contact plug 240_7 and the contact bar 220_1.

For the pull-down transistor PD2 of the SRAM cell 10_5, the contact plug 240_8 is configured to electrically connect the contact bar 220_8 to an overlying level (e.g., a metallization layer), so as to connect a VSS line 170_2 to the source region of the pull-down transistor PD2 of the SRAM cell 10_5 through the contact plug 240_8 and the contact bar 220_8. Furthermore, the contact plug 240_9 is configured to electrically connect the contact bar 220_8 to an overlying level (e.g., a metallization layer), so as to connect a VSS line 170_3 to the source region of the pull-down transistor PD2 of the SRAM cell 10_6 through the contact plug 240_9 and the contact bar 220_8. In some embodiments, the contact plugs 240_8 and 240_9 are configured to electrically connect the contact bar 220_8 to the same VSS line.

The VSS lines 170_2 and 170_3 are metal lines formed in a metallization layer. In some embodiments, the widths of the VSS lines 170_2 and 170_3 of the group GP2 are the same. In some embodiments, the width of the VSS line 170_2 or 170_3 of the group GP2 in FIG. 7 is less than the width of the VSS line 170_1 of the group GP1 in FIG. 3.

Compared with the group GP1 of FIG. 3, single shape of the contact plugs are used in the group GP2. In FIG. 7, the contact plugs 240_2 through 240_5 and 240_7 through 240_9 have the same shape, e.g., the square shape shown in FIG. 4B.

In some embodiments, each of the contact plugs 240_2 through 240_5 and 240_7 through 240_9 of the group GP2 includes the tungsten-containing region 240C without a barrier layer.

In some embodiments, the contact plugs coupled to the VSS lines, such as the contact plugs 240_7 through 240_9, include the tungsten-containing region 240C without a barrier layer, and the other contact plugs, such as the contact plugs 240_2 through 240_5, include a barrier layer 240A and a cobalt-containing region 240B.

In the SRAM cell 10_5, the source region of the pull-down transistor PD2 is coupled to the ground (e.g., VSS of FIG. 2) through at least two paths. One path is formed by the contact plug 240_8 and the VSS line 170_2, and another path is formed by the contact plug 240_9 and the VSS line 170_3. For the source region of the pull-down transistor PD2, the first path provides a first equivalent impedance and the second path provides a second equivalent impedance. By paralleling the first and second paths, the equivalent impedance is decreased for the source region of the pull-down transistor PD2. Thus, IR-drop is decreased for the contact plugs 240_8 and 240_9 coupled in parallel.

Figure 8:
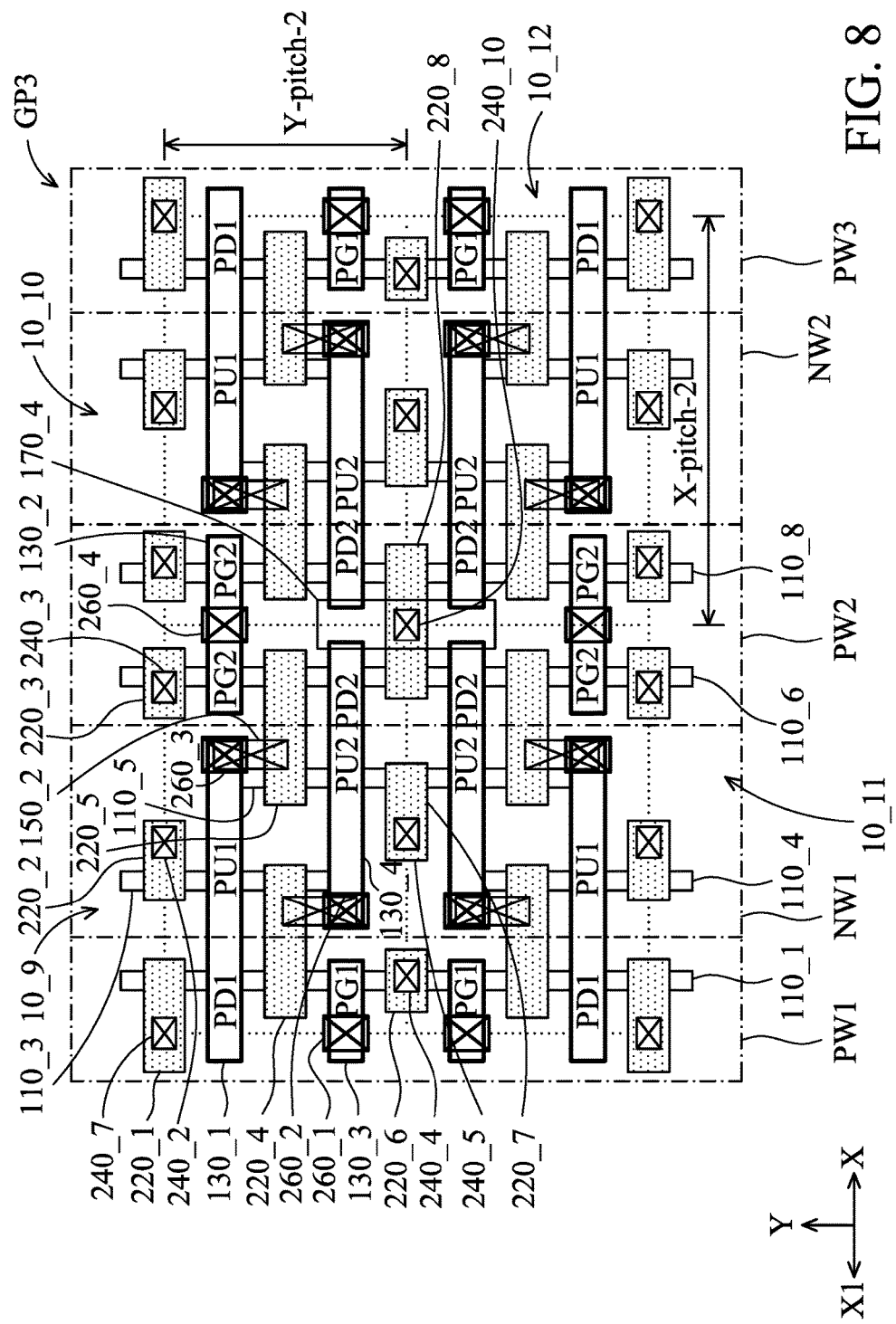
FIG. 8 shows a layout illustrating a SRAM structure of a group GP3 of the SRAM, in accordance with some embodiments of the disclosure.

FIG. 8 shows a layout illustrating a SRAM structure of a group GP3 of the SRAM 30, in accordance with some embodiments of the disclosure. The group GP3 includes four SRAM cells 10_9, 10_10, 10_11 and 10_12. The two adjacent SRAM cells 10_9 and 10_10 are arranged in the same row of the cell array of the SRAM 30. The two adjacent SRAM cells 10_9 and 10_11 are arranged in the same column of the cell array of the SRAM 30. The two adjacent SRAM cells 10_10 and 10_12 are arranged in the same column of the cell array of the SRAM 30. In other words, the two adjacent SRAM cells 10_11 and 10_12 are arranged in the same row of the cell array of the SRAM 30.

In the group GP3, each of the SRAM cells 10_9, 10_10, 10_11 and 10_12 has the same rectangular shape/region with a width X-pitch-2 and a height Y-pitch-2, and the height Y-pitch-2 is less than the width X-pitch-2. In some embodiments, the height Y-pitch-2 is equal to the height Y-pitch-1 of FIG. 3 and FIG. 7, and the width X-pitch-2 is less than the width X-pitch-1 of FIG. 3 and FIG. 7. Thus, area of each SRAM cell in the group GP3 is less than that of each SRAM in the groups GP1 and GP2.

A interconnect structure of the fourth adjacent SRAM cells 10_9 through 10_12 will be described below. It should be noted that various levels of the interconnect structure shown in FIG. 8 is merely an example and is not intended to limit the SRAM cells 10 of the SRAM. Furthermore, features in the group GP3 similar to those in the group GP1 of FIG. 3 will be omitted.

In the SRAM cell 10_9, the semiconductor fin 110_1 is configured to serve as the channel regions of the pass-gate transistor PG1 and the pull-down transistor PD1. Furthermore, the semiconductor fin 110_6 is configured to serve as the channel regions of the pass-gate transistor PG2 and the pull-down transistor PD2. The pass-gate transistor PG1 and the pull-down transistor PD1 are formed in the P-type well region PW1, and the pass-gate transistor PG2 and the pull-down transistor PD2 are formed in the P-type well region PW2.

In some embodiments, the two adjacent SRAM cells 10_9 and 10_10 are arranged in mirror symmetry along the Y-direction. Similarly, the two adjacent SRAM cells 10_11 and 10_12 are arranged in mirror symmetry along the Y-direction.

In the SRAM cells 10_9 through 10_12 of the group GP3, the pull-down transistors PD1 and PD2, the pass-gate transistors PG1 and PG2 and the pull-up transistors PU1 and PU2 are single-fin FETs.

The contact bar 220_8 is arranged to extend parallel to the X-direction, to across the semiconductor fin 110_8, and is also arranged to extend parallel to the X1-direction, to across the semiconductor fin 110_6. The X1-direction is opposite to the X-direction, and the Y-direction is perpendicular to the X-direction.

The contact bar 220_8 is positioned between the SRAM cells 10_9, 10_10, 10_11 and 10_12, such as an intersection of the SRAM cells 10_9, 10_10, 10_11 and 10_12. The contact bar 220_8 is electrically coupled to the VSS line 170_4 through the contact plug 240_10. The VSS line 170_4 is a metal line formed in a metallization layer.

In the group GP3 of FIG. 8, single shape of the contact plugs are used. In FIG. 8, the contact plugs 240_2 through 240_5, 240_7 and 240_10 have the same shape, e.g., the square shape shown in FIG. 4B.

In some embodiments, each of the contact plugs 240_2 through 240_5, 240_7 and 240_10 of the group GP3 includes the tungsten-containing region 240C without a barrier layer.

In some embodiments, the contact plugs coupled to the VSS lines, such as the contact plugs 240_7 and 240_10, include the tungsten-containing region 240C without a barrier layer, and the other contact plugs, such as the contact plugs 240_2 through 240_5, include a barrier layer 240A and a cobalt-containing region 240B.

Embodiments for SRAM structures are provided. By using a tungsten-containing region without a barrier layer to serve as the upper source/drain contact and using a barrier layer and a cobalt-containing region to serve as the lower source/drain contact, resistance of the contact is decreased, thus avoiding IR-drop from front-end-of-line (FEOL) to back-end-of-line (BEOL) semiconductor fabrication processes and preventing the upper source/drain contact is damaged that is induce by cobalt-loss in the lower source/drain contact. Furthermore, for the contact bar coupled to the ground VSS, by using a plurality of contact plugs with the second shape shown in FIG. 4B to replace a single contact with the first shape shown in FIG. 4A, the resistance of the contact is decreased and cobalt-loss may be avoided.

In some embodiments, a SRAM structure is provided. The SRAM structure includes multiple SRAM cells arranged in multiple rows and multiple columns. The SRAM cells are divided into multiple groups. A second SRAM cell is adjacent to a first SRAM cell in the same row. A third SRAM cell is adjacent to the first SRAM cell in the same column. A fourth SRAM cell is adjacent to the second SRAM in the same column and adjacent to the third SRAM in the same row. A plurality of first fins are parallel to a first direction and positioned within the first and third SRAM cells. A plurality of second fins are parallel to the first direction and positioned within the second and fourth SRAM cells. A contact bar extends parallel to a second direction to across the plurality of first fins and extends parallel to a third direction to across the plurality of second fins. A contact plug is formed on the contact bar and positioned between the first, second, third and fourth SRAM cells. A VSS line is electrically coupled to the contact bar through the contact plug. The first direction is perpendicular to the second direction, and the second direction is opposite to the third direction.

In some embodiments, a SRAM structure is provided. The SRAM structure includes a plurality of SRAM cells arranged in a plurality of rows and a plurality of columns. The SRAM cells are divided into a plurality of groups. A first SRAM cell is adjacent to the second SRAM cell in the same row. A third SRAM cell is adjacent to the first SRAM cell in the same column. A fourth SRAM cell is adjacent to the second SRAM in the same column and adjacent to the third SRAM in the same row. A plurality of first fins are parallel to a first direction and positioned within the first and third SRAM cells. A plurality of second fins are parallel to the first direction and positioned within the second and fourth SRAM cells. A contact bar extends parallel to a second direction to across the plurality of first fins and extends parallel to a third direction to across the plurality of second fins. A first contact plug is formed on the contact bar and positioned between the first and third SRAM cells. A second contact plug is formed on the contact bar and positioned between the second and fourth SRAM cells. A first VSS line is electrically coupled to the contact bar through the first contact plug. A second VSS line is electrically coupled to the contact bar through the second contact plug.

In some embodiments, a SRAM structure is provided. A plurality of SRAM cells arranged in a plurality of rows and a plurality of columns. The SRAM cells are divided into a plurality of groups. A first SRAM cell is adjacent to a first SRAM cell in the same row. A third SRAM cell is adjacent to the first SRAM cell in the same column. A fourth SRAM cell is adjacent to the second SRAM in the same column and adjacent to the third SRAM in the same row. A first fin is parallel to a first direction and positioned within the first and third SRAM cells. A second fin is parallel to the first direction and positioned within the second and fourth SRAM cells. A contact bar extends parallel to a second direction to across the first fin and extends parallel to a third direction to across the second fin. A contact plug is formed on the contact bar and positioned between the first, second, third and fourth SRAM cells. A VSS line is electrically coupled to the contact bar through the contact plug. The first direction is perpendicular to the second direction, and the second direction is opposite to the third direction.

The foregoing outlines nodes of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A Static Random Access Memory (SRAM) structure, comprising:
    a plurality of SRAM cells arranged in a plurality of rows and a plurality of columns, wherein the SRAM cells are divided into a plurality of groups, and each of the groups comprises:
        a first SRAM cell and a second SRAM cell adjacent to the first SRAM cell in the same row;
        a third SRAM cell adjacent to the first SRAM cell in the same column;
        a fourth SRAM cell adjacent to the second SRAM in the same column and adjacent to the third SRAM in the same row;
        a plurality of first fins parallel to a first direction and positioned within the first and third SRAM cells;
        a plurality of second fins parallel to the first direction and positioned within the second and fourth SRAM cells;
        a contact bar extending parallel to a second direction to across the plurality of first fins and extending parallel to a third direction to across the plurality of second fins;
        a contact plug formed on the contact bar and positioned between the first, second, third and fourth SRAM cells; and
        a VSS line electrically coupled to the contact bar through the contact plug,
        wherein the first direction is perpendicular to the second direction, and the second direction is opposite to the third direction.

2. The SRAM structure as claimed in claim 1, wherein the contact bar and the contact plug are formed of different materials.

3. The SRAM structure as claimed in claim 1, wherein the contact bar and the contact plug are formed of the same materials.

4. The SRAM structure as claimed in claim 1, wherein the contact bar is positioned in a first inter-layer dielectric (ILD) layer, and the contact plug is positioned in a second ILD layer over the first ILD layer.

5. The SRAM structure as claimed in claim 1, wherein the contact plug has a rectangular shape with a first dimension along the second direction and a second dimension along the first direction, wherein a ratio of the first dimension to the second dimension is greater than 1.2.

6. The SRAM structure as claimed in claim 1, wherein each of the first, second, third and fourth SRAM cells comprises:
    a first inverter, comprising:
        a first pull-down transistor formed in a first P-type well region of a substrate; and
        a first pull-up transistor formed in an N-type well region of the substrate;
    a second inverter cross-coupled to the first inverter, comprising:
        a second pull-down transistor formed in a second P-type well region of the substrate; and
        a second pull-up transistor formed in the N-type well region of the substrate;

a first pass-gate transistor formed in the first P-type well region and electrically coupled to an input terminal of the second inverter and an output terminal of the first inverter; and a second pass-gate transistor formed in the second P-type well region and electrically coupled to an output terminal of the second inverter and an input terminal of the first inverter, wherein the N-type well region is positioned between the first and second P-type well regions, wherein the VSS line is electrically coupled to a source of the second pull-down transistor through the contact bar and the contact plug.

7. The SRAM structure as claimed in claim 6, wherein in the first and third SRAM cell, each of the second pull-down transistor and the second pass-gate transistor formed in the second P-type well region comprises a multiple-fin field-effect transistor formed by the first plurality of fins, and in the second and fourth SRAM cell, each of the second pull-down transistor and the second pass-gate transistor formed in the second P-type well region comprises a multiple-fin field-effect transistor formed by the second plurality of fins.

8. A Static Random Access Memory (SRAM) structure, comprising:
a plurality of SRAM cells arranged in a plurality of rows and a plurality of columns, wherein the SRAM cells are divided into a plurality of groups, and each of the groups comprises:
a first SRAM cell and a second SRAM cell adjacent to the first SRAM cell in the same row;
a third SRAM cell adjacent to the first SRAM cell in the same column;
a fourth SRAM cell adjacent to the second SRAM in the same column and adjacent to the third SRAM in the same row;
a plurality of first fins parallel to a first direction and positioned within the first and third SRAM cells;
a plurality of second fins parallel to the first direction and positioned within the second and fourth SRAM cells;
a contact bar extending parallel to a second direction to across the plurality of first fins and extending parallel to a third direction to across the plurality of second fins;
a first contact plug formed on the contact bar and positioned between the first and third SRAM cells;
a second contact plug formed on the contact bar and positioned between the second and fourth SRAM cells;
a first VSS line electrically coupled to the contact bar through the first contact plug; and
a second VSS line electrically coupled to the contact bar through the second contact plug.

9. The SRAM structure as claimed in claim 8, wherein the contact bar and the first and second contact plugs are formed of different materials.

10. The SRAM structure as claimed in claim 8, wherein the contact bar and the first and second contact plugs are formed of the same materials.

11. The SRAM structure as claimed in claim 8, wherein the contact bar is positioned in a first inter-layer dielectric (ILD) layer, and the first and second contact plug are positioned in a second ILD layer over the first ILD layer.

12. The SRAM structure as claimed in claim 8, wherein the first and second contact plugs have a square shape with a first dimension along the second direction and a second dimension along the first direction, wherein the ratio of the first dimension to the second dimension is between 0.8 and 1.2.

13. The SRAM structure as claimed in claim 8, wherein each of the first, second, third and fourth SRAM cells comprises:
a first inverter, comprising:
a first pull-down transistor formed in a first P-type well region of a substrate; and
a first pull-up transistor formed in an N-type well region of the substrate;
a second inverter cross-coupled to the first inverter, comprising:
a second pull-down transistor formed in a second P-type well region of the substrate; and
a second pull-up transistor formed in the N-type well region of the substrate;
a first pass-gate transistor formed in the first P-type well region and electrically coupled to an input terminal of the second inverter and an output terminal of the first inverter; and
a second pass-gate transistor formed in the second P-type well region and electrically coupled to an output terminal of the second inverter and an input terminal of the first inverter,
wherein the N-type well region is positioned between the first and second P-type well regions,
wherein the first VSS line is electrically coupled to source of the second pull-down transistor through the contact bar and the first contact plug.

14. The SRAM structure as claimed in claim 13, wherein in the first and third SRAM cell, each of the second pull-down transistor and the second pass-gate transistor formed in the second P-type well region comprises a multiple-fin field-effect transistor formed by the first plurality of fins, and in the second and fourth SRAM cell, each of the second pull-down transistor and the second pass-gate transistor formed in the second P-type well region comprises a multiple-fin field-effect transistor formed by the second plurality of fins.

15. A Static Random Access Memory (SRAM) structure, comprising:
a plurality of SRAM cells arranged in a plurality of rows and a plurality of columns, wherein the SRAM cells are divided into a plurality of groups, and each of the groups comprises:
a first SRAM cell and a second SRAM cell adjacent to the first SRAM cell in the same row;
a third SRAM cell adjacent to the first SRAM cell in the same column;
a fourth SRAM cell adjacent to the second SRAM in the same column and adjacent to the third SRAM in the same row;
a first fin parallel to a first direction and positioned within the first and third SRAM cells;
a second fin parallel to the first direction and positioned within the second and fourth SRAM cells;
a contact bar extending parallel to a second direction to across the first fin and extending parallel to a third direction to across the second fin;
a contact plug formed on the contact bar and positioned between the first, second, third and fourth SRAM cells; and
a VSS line electrically coupled to the contact bar through the contact plug, wherein the first direction is perpendicular to the second direction, and the second direction is opposite to the third direction.

16. The SRAM structure as claimed in claim 15, wherein the contact bar and the contact plug are formed of different materials, and the contact plug has a square shape with a first dimension along the second direction and a second dimension along the first direction, wherein the ratio of the first dimension to the second dimension is between 0.8 and 1.2.

17. The SRAM structure as claimed in claim 15, wherein the contact bar and the contact plug are formed of the same materials, and the contact plug has a square shape with a first dimension along the second direction and a second dimension along the first direction, wherein the ratio of the first dimension to the second dimension is between 0.8 and 1.2.

18. The SRAM structure as claimed in claim 15, wherein the contact bar is positioned in a first inter-layer dielectric (ILD) layer, and the contact plug is positioned in a second ILD layer over the first ILD layer.

19. The SRAM structure as claimed in claim 15, wherein each of the first, second, third and fourth SRAM cells comprises:
a first inverter, comprising:
a first pull-down transistor formed in a first P-type well region of a substrate; and
a first pull-up transistor formed in an N-type well region of the substrate;
a second inverter cross-coupled to the first inverter, comprising:
a second pull-down transistor formed in a second P-type well region of the substrate; and
a second pull-up transistor formed in the N-type well region of the substrate;
a first pass-gate transistor formed in the first P-type well region and electrically coupled to an input terminal of the second inverter and an output terminal of the first inverter; and
a second pass-gate transistor formed in the second P-type well region and electrically coupled to an output terminal of the second inverter and an input terminal of the first inverter,
wherein the N-type well region is positioned between the first and second P-type well regions,
wherein the VSS line is electrically coupled to source of the second pull-down transistor through the contact bar and the contact plug.

20. The SRAM structure as claimed in claim 19, wherein in the first and third SRAM cell, each of the second pull-down transistor and the second pass-gate transistor formed in the second P-type well region comprises a single-fin field-effect transistor formed by the first fin, and in the second and fourth SRAM cell, each of the second pull-down transistor and the second pass-gate transistor formed in the second P-type well region comprises a single-fin field-effect transistor formed by the second fin.

* * * * *